United States Patent
Bjoerk et al.

(10) Patent No.: US 8,129,763 B2
(45) Date of Patent: Mar. 6, 2012

(54) METAL-OXIDE-SEMICONDUCTOR DEVICE INCLUDING A MULTIPLE-LAYER ENERGY FILTER

(75) Inventors: Mikael T. Bjoerk, Adliswil (CH); Siegfried F. Karg, Adliswil (CH); Joachim Knoch, Obfelden (CH); Heike E. Riel, Baech (CH); Walter H. Riess, Thalwil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 1064 days.

(21) Appl. No.: 12/027,712

(22) Filed: Feb. 7, 2008

(65) Prior Publication Data

US 2009/0200540 A1 Aug. 13, 2009

(51) Int. Cl.
*H01L 29/06* (2006.01)
(52) U.S. Cl. .................. 257/288; 257/344; 257/E29.262
(58) Field of Classification Search .................. 257/20, 257/288, 344, 347, 408–411, 135–136, 242, 257/329, E29.262
See application file for complete search history.

(56) References Cited

U.S. PATENT DOCUMENTS

| | | | |
|---|---|---|---|
| 4,866,488 A | 9/1989 | Frensley | |
| 5,365,083 A | 11/1994 | Tada | |
| 6,833,294 B1 * | 12/2004 | Mears et al. | .................. 438/162 |
| 2004/0262681 A1 * | 12/2004 | Masuoka et al. | .............. 257/335 |

OTHER PUBLICATIONS

P-F. Wang et al., "Investigation of a Novel Tunneling Transistor by MEDICI Simulation," IEEE, SISPAD, Sep. 2004, pp. 93-96.
D. Pawlik, "Field Induced Band-to-Band Tunneling Effect Transistor (FIBTET)," IEEE, 23rd Annual Microelectronic Engineering Conference, May 2005, pp. 18-21.

* cited by examiner

*Primary Examiner* — Cuong Q Nguyen
*Assistant Examiner* — Tran Tran
(74) *Attorney, Agent, or Firm* — Stephen C. Kaufman; Ryan, Mason & Lewis, LLP

(57) ABSTRACT

A MOS device includes first and second source/drains spaced apart relative to one another. A channel is formed in the device between the first and second source/drains. A gate is formed in the device between the first and second source/drains and proximate the channel, the gate being electrically isolated from the first and second source/drains and the channel. The gate is configured to control a conduction of the channel as a function of a potential applied to the gate. The MOS device further includes an energy filter formed between the first source/drain and the channel. The energy filter includes a superlattice structure wherein a mini-band is formed. The energy filter is operative to control an injection of carriers from the first source/drain into the channel. The energy filter, in combination with the first source/drain, is configured to produce an effective zero-Kelvin first source/drain.

21 Claims, 4 Drawing Sheets

METAL-OXIDE-SEMICONDUCTOR DEVICE INCLUDING A MULTIPLE-LAYER ENERGY FILTER

FIELD OF THE INVENTION

The present invention relates to the electrical and electronic arts, and, more particularly, to metal-oxide-semiconductor (MOS) transistor devices.

BACKGROUND OF THE INVENTION

In recent years, improvements of CMOS technology have led to an enormous down-scaling of MOS field-effect transistors (FETs). MOSFET devices with channel lengths less than about 10 nanometers (nm) have been demonstrated. However, besides fabrication-related progress, generally in the form of reduced device geometries, power consumption of highly integrated circuits is becoming more critical, particularly as the demand for high-performance, low-power devices increases. In this respect, the limitation of any conventional FETs to a minimum subthreshold swing, S, of 60 millivolts per decade (mV/dec) at room temperature becomes a major obstacle to further reduce the operational voltage while leaving an on/off-ratio of the devices constant.

In a MOSFET device, the minimum voltage swing needed to switch the device from an "on" state to an "off" state is an important figure of merit for determining low power performance of the device. This characteristic is usually quantified by measuring how many millivolts (mV) it takes to change the drain current in the device by one order of magnitude, i.e. one decade of current on a logarithmic scale. The measure of this characteristic is called the inverse subthreshold slope and is given in units of mV/decade of current change. In a MOSFET device, the subthreshold swing is limited by thermal voltage, $kT/q$, where k is Boltzmann's constant ($1.38 \times 10^{-23}$ J/° K), T is temperature in degrees Kelvin (° K), and q is the charge of an electron ($1.60 \times 10^{-19}$ C). This thermal voltage is about 26 mV at room temperature (e.g., about 300° K), and hence $S = (kT/q) \cdot \ln(10) = 60$ mV/dec.

Provided a certain ratio between the off-state and the on-state current of approximately three orders of magnitude is required and if we assume that two thirds of the maximum applied gate voltage is needed to obtain a high on-state current, one needs at least a gate voltage range of about $3 \times (3 \cdot 60) = 540$ mV to properly operate the device. In turn, this means that scaling down the supply voltage of devices limited to a subthreshold swing of 60 mV/dec leaves only two options: either the off-state leakage is increased or the on-state performance is deteriorated. Accordingly, transistor devices that show an inverse subthreshold slope significantly steeper than 60 mV/dec and still provide a high on-state performance are particularly desirable.

SUMMARY OF THE INVENTION

Illustrative embodiments of the present invention meet the above-noted need by providing techniques for forming a MOS transistor device capable of achieving an inverse subthreshold slope that is smaller than about 60 mV/dec. To accomplish this, an energy filter including a multiple-layer superlattice structure is inserted in the device between a source and a channel in the device. The energy filter can be "tuned" in terms of certain characteristics, including energetic width and position, in order to achieve a desired trade-off between high on-state current and low off-state leakage (and steep inverse subthreshold slope) in the device. This can be achieved, in accordance with aspects of the invention, by adjusting one or more dimensions and/or materials of the superlattice.

In accordance with one aspect of the invention, a MOS device includes first and second source/drains spaced apart relative to one another. A channel is formed in the device between the first and second source/drains. A gate is formed in the device between the first and second source/drains and proximate the channel, the gate being electrically isolated from the first and second source/drains and the channel. The gate is configured to control a conduction of the channel as a function of a potential applied to the gate. The MOS device further includes an energy filter formed between the first source/drain and the channel. The energy filter includes a superlattice structure wherein a mini-band is formed. The energy filter is operative to control an injection of carriers from the first source/drain into the channel.

In accordance with another aspect of the invention, a method of forming a MOS device includes the steps of: forming first and second source/drains, the first and second source/drains being spaced apart relative to one another; forming a channel between the first and second source/drains; forming a gate between the first and second source/drains and proximate the channel, the gate being electrically isolated from the first and second source/drains and channel and being configured to control a conduction of the channel as a function of a potential applied to the gate; and forming an energy filter between the first source/drain and the channel, the energy filter comprising a superlattice structure wherein a mini-band is formed, the energy filter being operative to control an injection of carriers from the first source/drain into the channel.

These and other features, aspects, and advantages of the present invention will become apparent from the following detailed description of illustrative embodiments thereof, which is to be read in connection with the accompanying drawings.

DETAILED DESCRIPTION OF THE INVENTION

One or more embodiments of the present invention provide a means for forming a transistor device capable of achieving an inverse subthreshold slope smaller than about 60 mV/dec. While certain aspects of the invention are described herein in the context of implementations of a MOSFET device formed using a complementary metal-oxide-semiconductor (CMOS) fabrication process, it should be understood, however, that the present invention is not limited to the specific implementations shown, nor is the invention limited to a CMOS fabrication process.

Figure 1:
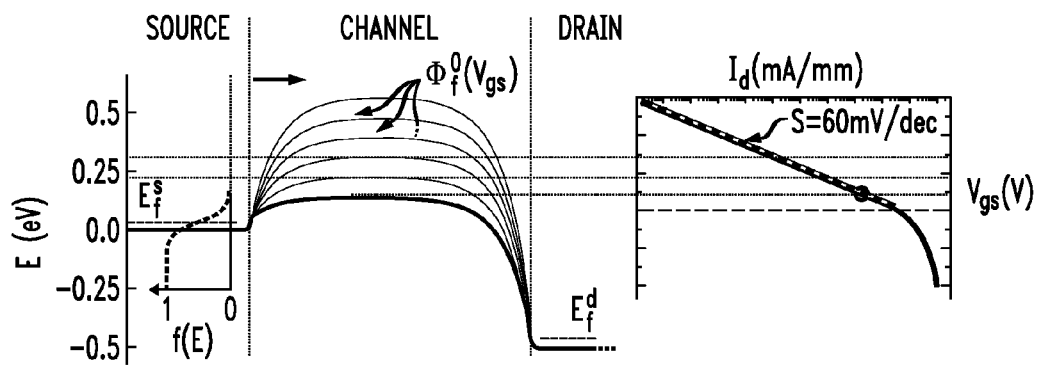
FIG. 1 illustrates a conduction band diagram corresponding to a conventional MOSFET device along the direction of carrier transport for several gate voltages.

One reason for the limitation of subthreshold swing to about 60 mV/dec is that the switching mechanism of conventional MOSFET devices relies primarily on the modulation of carrier injection from a thermally broadened Fermi function. FIG. 1 illustrates a conduction band in a conventional MOSFET device along a direction of carrier transport in a channel of the device for several different gate voltages. As apparent from the figure, if the device is electrostatically well-designed, a change in gate voltage will lead to an equivalent change in the potential maximum in the channel (i.e., the maximum barrier within the channel), $\Phi_f^0$, that determines the injection of carriers in the channel. As a result, the drain current increases exponentially with a minimum subthreshold swing S of about 60 mV/dec. The right panel in FIG. 1 provides an exemplary graph depicting drain current versus gate voltage on a logarithmic scale; here, $E_f^s$ and $E_f^d$ are the source and drain Fermi energy levels, respectively. The inverse subthreshold slope is indicated by the dashed line appearing in the figure. For increasing gate voltage, an increasingly greater fraction of carriers residing in the exponential tail of the source Fermi function can contribute to the current and hence give rise to an exponential increase of current with an inverse subthreshold slope of:

$$S = \ln(10) \cdot (\partial I_d / \partial V_{gs} \cdot 1/I_d)^{-1} = \left(\frac{k_B T}{q}\right) \cdot \ln(10) = 60 \text{ mV/dec},$$

where $\partial I_d / \partial V_{gs}$ is the partial derivative of drain current ($I_d$) as a function of gate-to-source voltage ($V_{gs}$) of the device.

Since the switching mechanism of conventional MOSFET devices is dependent on modulation of the injection of carriers from a thermally broadened Fermi function, then in order to achieve subthreshold swings below 60 mV/dec, as stated above, current injection from a source of the device is preferably modified in such a way that it becomes independent of the thermally broadened Fermi distribution function. This can be accomplished, in accordance with aspects of the invention, by inserting an energy filter between the source and the channel of the device which substantially cuts off high- and low-energy tails of the source Fermi distribution, thereby leading to an effective "cooling" of the Fermi function.

It is to be appreciated that, in the case of a simple MOSFET device, because the MOSFET device is symmetrical by nature, and thus bidirectional, the assignment of source and drain designations in the device is essentially arbitrary. Hence, the energy filter may, in other embodiments of the invention, be formed between the drain and the channel of the device. More generically, the source and drain may be referred to as first and second source/drain, respectively, where "source/drain" in this context denotes a source or a drain.

Recently, it was shown that a FET device utilizing band-to-band tunneling (BTBT) provides an effective means of reducing short channel effects in the device, thereby allowing scaling (e.g., reduction of device geometries) to a larger extent than otherwise possible in standard MOSFET devices (see, e.g., U.S. Pat. No. 5,365,083 to Tada, the disclosure of which is incorporated by reference herein). However, BTBT FETs exhibit the following drawbacks:

Since BTBT FETs comprise a tunneling barrier, BTBT FETs always exhibit on-state currents which are significantly lower when compared to conventional MOSFET devices.

On-state currents of BTBT FETs can be made larger but require extremely scaled gate oxide thicknesses and very thin diameters of nanowires used as active channel material. Such thin gate oxides lead to large off-state leakage currents due to direct tunneling through the gate dielectric, thereby diminishing certain advantages of BTBT FETs.

To ensure a high probability that BTBT will occur in the device, extremely abrupt doping profiles and very high doping levels are required in the BTBT FETs, which are difficult, and thus costly, to manufacture.

In order for the BTBT FETs to function, a doped source contact is necessary which leads to excessive variability as the devices are scaled, for example, to a nanometer range. Furthermore, thinning, for instance, semiconductor (e.g., silicon) nanowires in the device leads to a deactivation of dopants. Moreover, a doped contact section leads to parasitic resistances.

A gate of the BTBT FET device must be aligned as accurately as possible with respect to a source side p-n junction of the device in order to provide optimum gate control over the channel without significantly affecting the source contact.

In order to increase the probability that BTBT will occur in the BTBT FET device, the energy gap in the device should not be too large. A small band gap, however, typically leads to a significant increase in off-state leakage currents. Furthermore, the BTBT FET device exhibits ambipolar conduction, and hence the maximum allowed drain-to-source voltage ($V_{ds}$) in the device will be limited.

Figure 2:
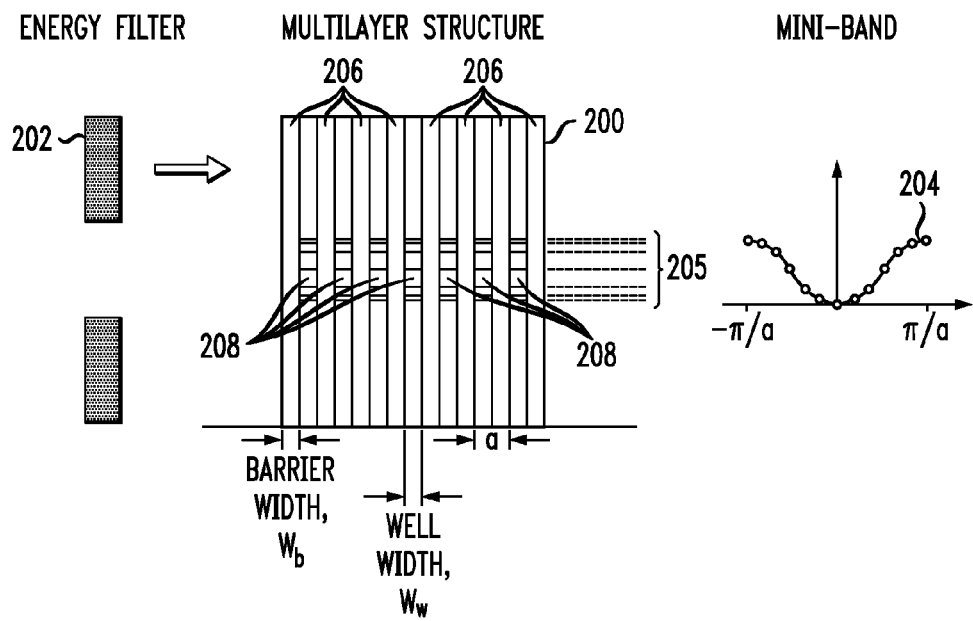
FIG. 2 is a conceptual diagram illustrating realization of an exemplary energy filter, in accordance with an embodiment of the present invention.

With reference now to FIG. 2, an implementation of an exemplary energy filter 200 is shown, in accordance with an embodiment of the invention. The energy filter 200 is depicted alongside its visual representation 202 and its graphical filter "transfer function" 204. The energy filter 200, in combination with an electrically conductive electrode, preferably a metal electrode (see FIG. 4), attached to the energy filter, essentially replaces the doped semiconductor source contact of a conventional MOSFET device.

Energy filter 200 is preferably realized as a multilayer semiconductor structure wherein a mini-band 205 is formed. More particularly, illustrative energy filter 200 comprises a plurality of alternating semiconductor barrier layers 206 and well layers 208 forming a superlattice. The barriers layers 206 preferably act as energy band modifying layers. Although shown as comprising alternating single barrier and well layers, energy filter 200 may alternatively comprise multiple barrier layers sandwiched between single well layers, multiple well layers sandwiched between single barrier layers, or any combination of multiple barrier layers and multiple well layers, as will be understood by those skilled in the art given the teachings herein.

It is believed that barriers layers 206 and adjacent well layers 208 cause the superlattice to exhibit a lower conductivity for charge carriers in a parallel layer direction than would otherwise be present. This parallel direction is orthogonal to a stacking direction (i.e., a direction in which the barrier layers 206 and well layers 208 are formed) in the energy filter 200. It is further believed that this lower conductivity of the superlattice results in higher charge carrier mobility therein.

One or more of the barrier layers 206 preferably comprise, for example, aluminum arsendide (AlAs), gallium phosphide (GaP), gallium-aluminum-arsenium (GaAlAs), aluminum antimonide (AlSb), etc., although alternative materials may be employed. All of the barrier layers 206 may be formed of the same material, although it is further contemplated that one or more of the barriers layers may be formed of different materials. One or more of the well layers 208 preferably comprise, for example, indium arsenide (InAs), gallium arsenide (GaAs), gallium antimonide (GaSb), indium gallium arsenide (InGaAs), indium gallium arsenide phosphide (InGaAsP), silicon, etc., although alternative materials are contemplated. All of the well layers 208 may be formed of the same material, although it is further contemplated that one or more of the well layers may be formed of different materials.

A semiconductor superlattice is based on a periodic structure of alternating layers of semiconductor materials with wide and narrow band gaps. If the thickness of the wide-bandgap barrier layers 206 is small enough such that electrons may tunnel through, then the scenario becomes similar to what happens when individual atoms are brought together in a crystal lattice. In this case, individual levels in the quantum wells are split into bands, called mini-bands. In a crystal, the periodic atomic potential leads to band formation; in a superlattice, an artificial periodic potential causes the formation of mini-bands. Superlattices can be formed in a number of ways. For example, one standard technique for forming a superlattice employs molecular-beam epitaxy and sputtering. With these methods, lattices as thin as a few atomic layers can be produced.

An energetic position and/or width of the mini-band 205 formed by the energy filter 200 can be adjusted by tuning barrier widths, $W_b$, well widths, $W_w$, and/or barrier heights, $H_b$, of the energy filter 200. For example, the energetic width of the mini-band can be controlled as a function of the respective widths of the barrier layers 206. Likewise, the energetic position of the mini-band can be controlled as a function of the respective widths of the well layers 208. As shown in the figure, the respective widths of barrier layers 206 are preferably substantially the same, although an energy filter 200 having barrier layers of different widths relative to one another is similarly contemplated. Likewise, the respective widths of well layers 208 are preferably substantially the same, although well layers of different widths relative to one another may be similarly employed. The energetic width of the mini-band 205 in the energy filter 200 is preferably controlled so as to optimize a trade-off between increased on-state current in the device and increased efficiency of the energy filter.

Figure 3:
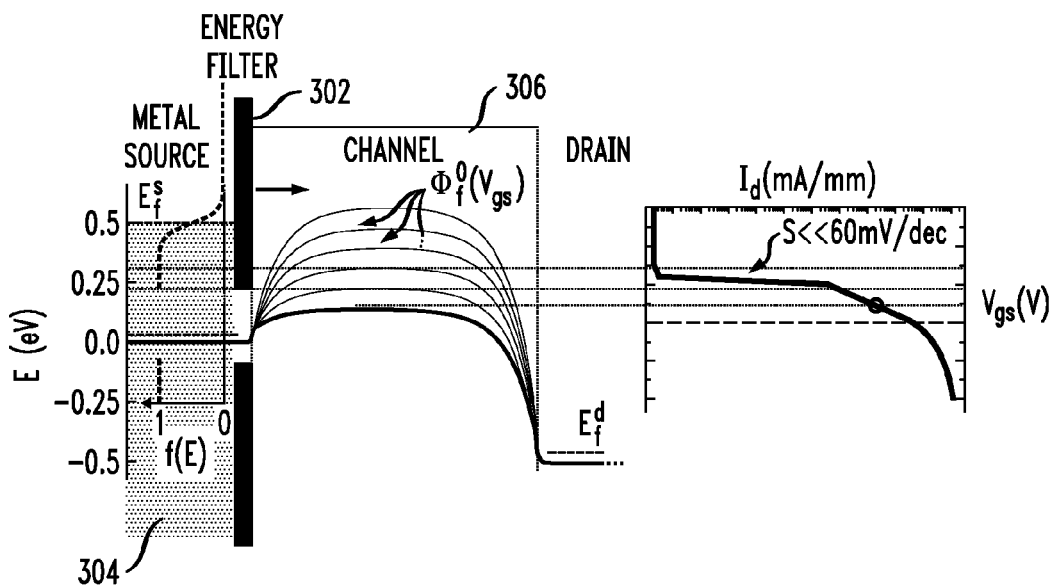
FIG. 3 is a conduction band diagram corresponding to an exemplary MOSFET device along the direction of carrier transport in a channel of the device for several different gate voltages, in accordance with an aspect of the present invention.

FIG. 3 is a conduction band diagram corresponding to an exemplary MOSFET device along the direction of carrier transport in a channel of the device for several different gate voltages, in accordance with an aspect of the invention. An energy filter 302 is formed between a metal source electrode 304 and a channel 306 in the device. The energy filter 302 includes an energetic window, visualized as an opening in the energy filter. Ideally, carriers may only be injected into the channel through the energetic window.

As shown in FIG. 3, the Fermi energy of the metal source electrode, $E_f^S$, lies significantly above the upper bound of the energy filter 302. Carriers can only be injected within the energetic window where the Fermi distribution is close to unity. As apparent from the figure, increasing the gate voltage leads to a very steep increase in drain current, $I_d$, with substantially the same on-state current as in the conventional device depicted in FIG. 1. The right panel of FIG. 3 shows exemplary drain current $I_d$ versus gate-to-source voltage, $V_{gs}$, on a logarithmic scale.

Figure 4:
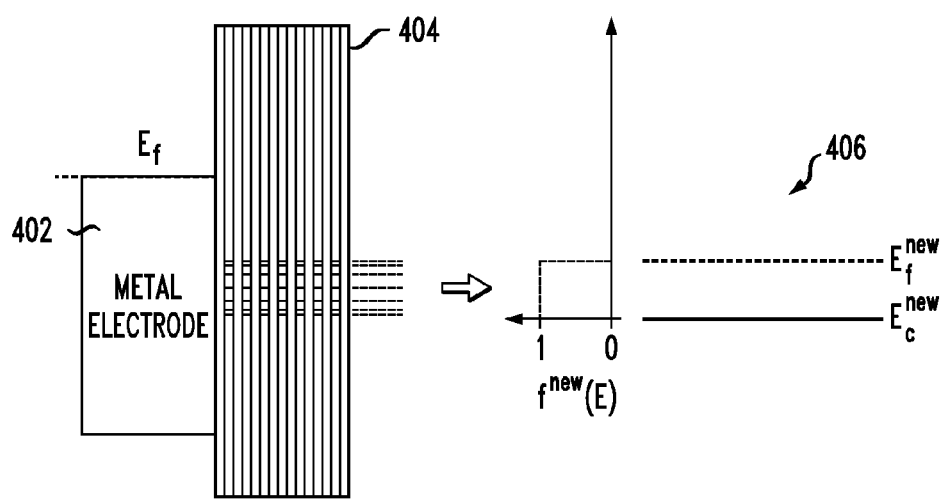
FIG. 4 is a conceptual diagram illustrating realization of an exemplary energy filter and source electrode, along with its corresponding Fermi distribution, in accordance with an aspect of the present invention.

One key feature of the metal source electrode and superlattice combination is the ability to adjust the energetic position of the mini-band in a way that the Fermi energy of the metal electrode is several $k_B T$ above (below) an upper (lower) bound of the mini-band. If $E_f^S$ is well above the upper bound of the mini-band, as shown in FIG. 3, the mini-band cuts out a part of the Fermi distribution function of the metal electrode where it is essentially unity, yielding a contact for carrier injection from an essentially "zero-Kelvin" Fermi distribution function. As a result, a device which exhibits such an effective zero-Kelvin source provides extremely steep inverse subthreshold slopes over several orders of magnitude in current, as illustrated in FIG. 4. The on-state current will be of substantially the same order as in a conventional MOSFET device and is tunable by changing the energetic width of the energy filter, as previously explained. Moreover, off-state leakage currents will be effectively blocked by the energy filter, thereby advantageously resulting in a MOS device having extremely low off-state current.

With reference to FIG. 4, a portion of an exemplary MOS device is shown comprising a metal source electrode 402, or alternative conductive electrode, and an energy filter 404, implemented as a superlattice structure, in electrical connection with the source electrode. The corresponding Fermi distribution 406 is also shown. If the Fermi energy, $E_f$, of the electrode 402 is significantly above the upper bound of the mini-band, the electrode-superlattice combination modifies the source contact to have an effective temperature close to zero Kelvin.

Particularly with respect to processing steps, it is emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of standard process steps used to fabricate such semiconductor devices may be found in a number of publications, for example, S. Wolf and R. N. Tauber, *Silicon Processing for the VLSI Era, Volume 1*, Lattice Press, 1986 and S. M. Sze, *VLSI Technology, Second Edition*, McGraw-Hill, 1988, both of which are incorporated herein by reference.

It should also be understood that the various layers and/or regions shown in the accompanying figures are not drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit device.

Figure 5:
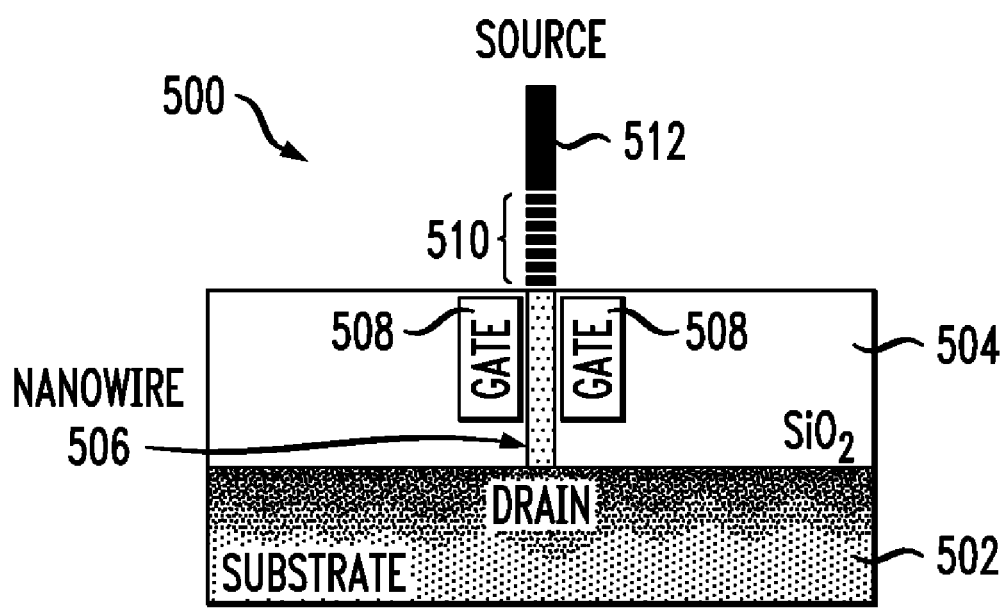
FIG. 5 is a cross-sectional view depicting an exemplary silicon fin transistor device including an energy filter, formed in accordance with an embodiment of the present invention.

FIG. 5 is a cross-sectional view depicting an exemplary transistor device 500 including an energy filter, in accordance with an embodiment of the invention. Device 500 is implemented as a vertical fin FET, also referred to as a FinFET device. A FinFET is one example of a double-gate structure that includes a channel formed as a substantially vertical fin (hence the name). A semiconductor (e.g., silicon) fin, also referred to as a semiconductor nanowire or nanotube (if the fin has a quadratic or circular footprint), transistor is formed on a substrate 502 and embedded into a silicon dioxide layer 504, or alternative insulating layer, formed on at least a portion of an upper surface of the substrate. The nanotube may comprise, for example, a carbon nanotube. The substrate 502 serves as a drain of the transistor in this embodiment, although in alternative arrangements a separate drain may be formed. The device 500 further includes a channel 506 formed through the silicon dioxide layer 504. A first end of the channel 506 is electrically connected to the substrate 502 and a second end of the channel is substantially planar with an upper surface of the silicon dioxide layer 504. A gate 508 is formed in the silicon dioxide layer 504. The gate 508 preferably surrounds and is in close proximity to the channel 506. The gate 508 may be formed as at least a partial ring structure substantially surrounding the channel 506.

The structure including the silicon dioxide layer 504 and channel 506 is preferably planarized, such that the upper surface of the silicon dioxide layer is substantially even (planar) with the second end of the channel. Subsequently, an energy filter 510 is deposited on at least an upper surface of the channel 506, followed by deposition of a source contact 512 on at least a portion of an upper surface of the energy filter. The source contact 512 and the energy filter 510 are then patterned as illustrated in the figure. The energy filter 510 includes a plurality of alternating semiconductor barrier layers and well layers forming a superlattice, as may be formed in a manner consistent with the teachings set forth herein.

Figure 6:
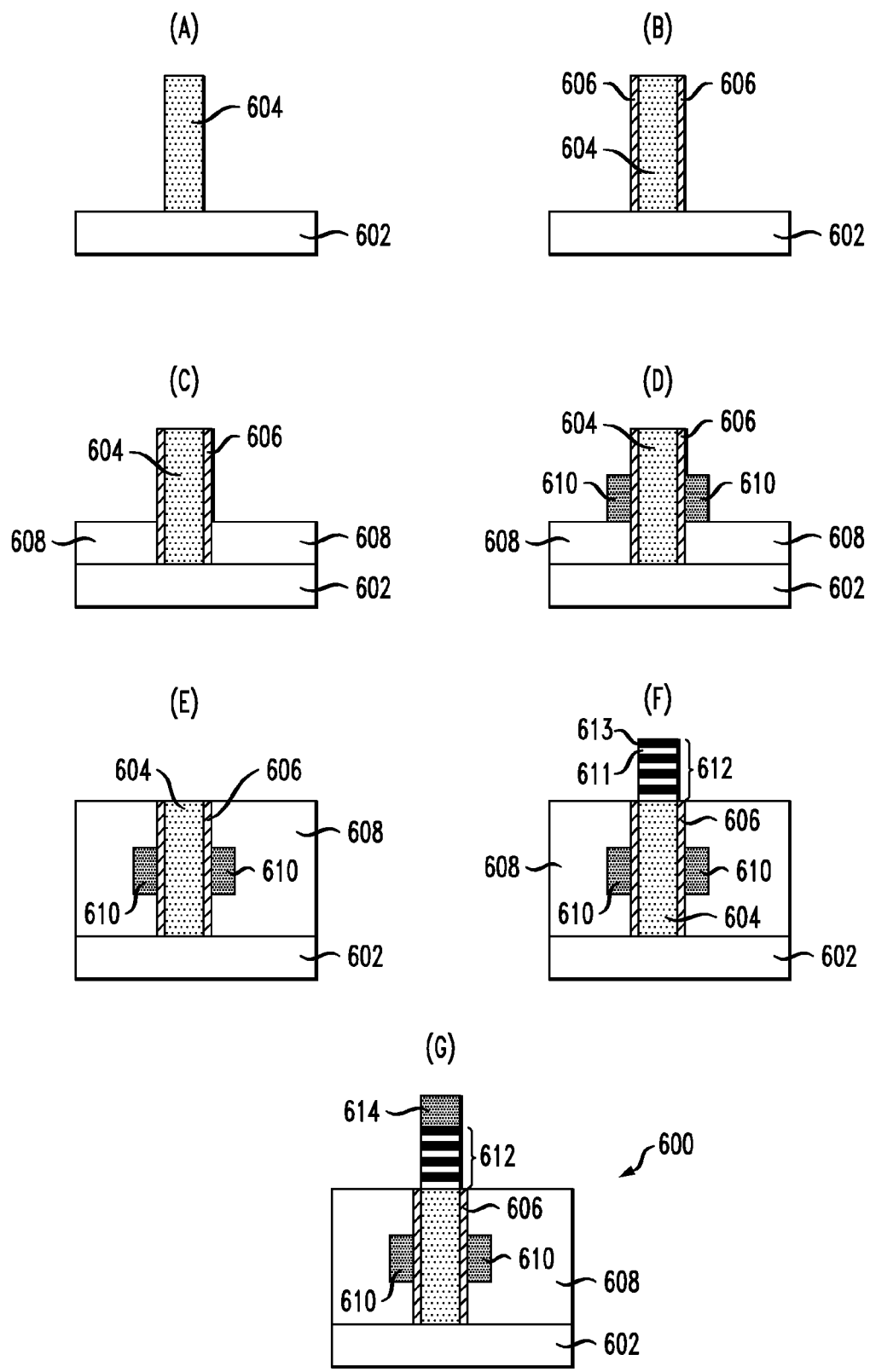
FIGS. 6A through 6G are cross-sectional views depicting integrated circuit processing steps in forming the silicon fin transistor shown in FIG. 5, in accordance with an embodiment of the invention.

FIGS. 6A through 6G are cross-sectional views depicting integrated circuit processing steps which may be used in forming the exemplary semiconductor fin transistor (FinFET) shown in FIG. 5, in accordance with an embodiment of the invention. FIG. 6A depicts the formation of a semiconductor nanowire 604 on at least a portion of an upper surface of a substrate 602. Nanowire 604 may be fabricated, for example, by etching the substrate 602 or by epitaxial growth (e.g., vapor-liquid-solid growth using a metal catalyst, or alternative material, which is subsequently removed or by selective area epitaxy). Suitable materials for forming nanowire 604 include, but are not limited to, silicon, germanium, gallium arsenide, indium arsenide (InAs), indium antimonide (InSb), indium phosphide, etc., either doped or undoped. Preferably, the substrate 602 has a conductivity type associated therewith which is opposite a conductivity type of the nanowire 604, so that an active region can be formed in the device.

The substrate 602 is commonly formed of single-crystal silicon (e.g., having a <100> or <111> crystal orientation), although suitable alternative materials may also be used, such as, but not limited to, germanium (Ge), gallium arsenide (GaAs), indium phosphide (InP), etc. Additionally, the substrate is preferably modified by adding an impurity or dopant to change the conductivity of the material (e.g., n-type or p-type). For example, in one embodiment of the invention, the substrate 602 is of p-type conductivity and may thus be referred to as a p+ substrate. A p+ substrate may be formed by adding a p-type impurity or dopant (e.g., boron) of a desired concentration (e.g., about $5 \times 10^{18}$ to about $5 \times 10^{19}$ atoms per cubic centimeter) to the substrate material, such as by a diffusion or implant step, to change the conductivity of the material as desired. Substrate 602 may be a handle wafer of a silicon-on-insulator (SOI) substrate which can also have very low doping concentration.

The term "semiconductor layer" as may be used herein is intended to broadly encompass any semiconductor material upon which and/or in which other materials may be formed. The semiconductor layer may comprise a single layer, such as, for example, substrate 602, or it may comprise multiple layers, such as, for example, the substrate and an epitaxial layer (not shown). The semiconductor wafer comprises the substrate 602, with or without the epitaxial layer, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

FIG. 6B illustrates the formation of a gate oxide layer 606 on at least sidewalls of the nanowire 604. Gate oxide layer 606 may be formed, for example, using thermal oxidation or atomic layer deposition, although alternative fabrication techniques may be similarly employed. Suitable materials for forming gate oxide layer 606 include, but are not limited to, silicon dioxide, aluminum oxide ($Al_2O_3$), hafnium oxide ($HfO_2$), etc.

FIGS. 6C through 6E depict steps for fabricating a gate of the FinFET device. Specifically, an insulating layer 608 is first formed on at least a portion of the upper surface of the substrate 602, as shown in FIG. 6C, using thermal oxidation or deposition (e.g., chemical vapor deposition (CVD)). Insulating layer 608 preferably comprises silicon dioxide ($SiO_2$), although other low dielectric constant (k) dielectric materials (e.g., k less than about 4) may be used, such as, for example, polymers containing elements of Si, C, O and H, including organosilicate glass (SiCOH), methylsiloxane, methylsilsesquioxanes, and other organic and inorganic polymers. Insulating layer 608 may be formed, for example, using an oxidation step to form silicon dioxide, although alternative methodologies for forming the insulating layer are contemplated, such as, for example, deposition.

Next, a gate 610 is formed on at least a portion of an upper surface of the insulating layer 608, proximate the nanowire 604, as shown in FIG. 6D. Preferably, gate 610 substantially surrounds nanowire 604. The gate 610 may be formed of, for example, metal (e.g., aluminum, copper, gold, etc.), although alternative suitable conductive or semiconductive materials (e.g., polysilicon) may be similarly employed. The insulating layer 608 serves to electrically isolate the gate 610 from the nanowire 604. Gate 610 may be formed using, for example, sputtering of a metal or polysilicon CVD, followed by etching to adjust a shape (e.g., height) of the gate. However, the invention is not limited to forming the gate 610 in this manner.

Once the gate 610 is formed, insulating layer 608 is extended, such as by thermal oxidation or deposition, so as to make the insulating layer substantially planar with the nanowire 604 as shown in FIG. 6E. A chemical mechanical polishing (CMP) step, or alternative process, may be used to planarize the upper surface of the insulating layer 608 and nanowire 604.

FIG. 6F illustrates the formation of an energy filter 612 on at least a portion of the upper surface of nanowire 604. Energy filter 612 is preferably formed as a superlattice structure including a plurality of alternating semiconductor barrier layers 613 and well layers 611. Fabrication of the energy filter could be achieved, for example, using molecular beam epitaxy (MBE), chemical beam epitaxy (CBE), or metal oxide chemical vapor deposition (MOCVD), as will be understood by those skilled in the art. Suitable materials which can be employed include, for example, GaAs/AlGaAs, GaAs/AlAs, gallium nitride (GaN)/aluminum gallium nitride (AlGaN), InGaAs/InP, InGaAsP/InP, GaSb/AlSb, Si/GaP, etc. When formed in a nanowire using bottom up growth techniques such as, for example, vapor-liquid-solid (VLS), almost any combination irrespective of lattice mismatch (e.g. InAs/InP (3.7%), GaAs/InAs (6.7%), GaAs/AlP) could be grown due to efficient strain relaxation. Suitable materials and dopants for forming the energy filter 612 were provided above in connection with FIG. 2.

A source contact 614, which comprises a conductive material (e.g., metal) or a semiconducting material (e.g., polysilicon), is then formed on an upper surface of the energy filter 612, such as by deposition, as depicted in FIG. 6G. The source contact 614 in conjunction with the energy filter 612 including the superlattice will preferably replace a traditional source region formed in a conventional manner. A primary function of the source contact 614 is to supply carriers for injection into the nanowire 604. An energetic window in the energy filter 612 through which carriers pass may be controlled by selectively adjusting one or more characteristics of the superlattice structure, including, but not limited to, width of the barrier layers 613, width of the well layers 611, type of materials used for the barrier and/or well layers, height of the barrier and/or well layers, etc.

The nanowire 604 preferably serves as a channel for the FinFET device 600 and the substrate 602 serves as a drain for the device. Source contact 614 supplies the carriers which are injected into the nanowire channel. When a voltage is applied to the gate 610, an inversion layer will be formed in the nanowire channel 604. In this manner, the gate potential controls a current conduction in the device. It is to be understood that the device depicted in FIGS. 6A through 6G is provided by way of illustration only, and that other device arrangements within the scope of the present invention may be fabricated by those skilled in the art given the teachings herein.

Embodiments of the present invention provide, inter alia, the following advantages over standard transistor devices:

- The effective "zero-Kelvin" source contact enables extremely steep inverse sub-threshold slopes over several orders of magnitude, and thus also provides very low off-state leakage current.
- The very small off-state current achievable with the use of the energy filter results in extremely high on/off rations.
- The inverse sub-threshold slope will be substantially independent of temperature. As a result, ICs can be operated even at higher temperatures without a significant change in sub-threshold slope.
- Using a metallic, or alternative low-resistance material, source contact lead to significantly lower parasitic resistances of the source/drain contacts when compared to doped semiconductors.
- The multilayer energy filter can be fabricated using standard deposition techniques, such as, for example, atomic layer deposition (ALD), metal organic chemical vapor deposition (MOCVD) and molecular-beam epitaxy (MBE), which facilitates an extremely well-controlled fabrication process and a well-defined geometry, thereby reducing variability.
- Short channel effects are less severe compared to conventional MOSFET devices. In principle, even a device exhibiting short channel effects would still lead to steep inverse sub-threshold slopes and low off-state current. This greatly relaxes fabrication constraints.
- Even materials having a small band-gap but higher mobility can be used since the current is blocked by the superlattice energy filter and not by the small band-gap as in standard MOSFET devices or BTBT FET devices.
- If the energy filter is grown on top of semiconductor nanowires, materials with large lattice mismatch can be combined, thus extending the design possibilities for the superlattice. Especially if the energy filter is grown on top of a semiconductor nanowire, the entire device would be CMOS compatible and grown directly on a silicon platform.

Techniques of the present invention are well-suited for implementation in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide semiconductor (MOS) device, comprising:
   first and second source/drains spaced apart relative to one another;
   a channel formed between the first and second source/drains;
   a gate formed between the first and second source/drains and proximate the channel, the gate being electrically isolated from the first and second source/drains and channel, the gate being configured to control a conduction of the channel as a function of a potential applied to the gate; and
   an energy filter formed between the first source/drain and the channel, the energy filter comprising a superlattice structure wherein a mini-band is formed, the energy filter being operative to control an injection of carriers from the first source/drain into the channel, the energy filter in combination with the first source/drain being configured to produce an effective zero-Kelvin first source/drain.

2. The device of claim 1, wherein the superlattice structure in the energy filter is configured so as to substantially cut off at least a portion of a Fermi distribution function of the first source/drain.

3. The device of claim 1, wherein the superlattice structure comprises a plurality of alternating semiconductor barrier layers and well layers.

4. The device of claim 3, wherein respective widths of each of the barrier layers are the same.

5. The device of claim 3, wherein respective widths of each of the well layers are the same.

6. The device of claim 3, wherein respective widths of at least two of the barrier layers are different.

7. The device of claim 3, wherein respective widths of at least two of the well layers are different.

8. The device of claim 1, wherein the mini-band has at least one of a controllable energetic width and a controllable energetic position associated therewith.

9. The device of claim 8, wherein the superlattice structure comprises a plurality of alternating semiconductor barrier layers and well layers, the energetic width of the mini-band being controllable as a function of a width of at least one of the semiconductor barrier layers and the energetic position of the mini-band being controllable as a function of a width of at least one of the well layers.

10. The device of claim 1, wherein an energetic width of the mini-band in the energy filter is controlled so as to optimize a trade-off between increased on-state current in the device and increased efficiency of the energy filter.

11. The device of claim 1, wherein at least one of an energetic width and an energetic position of the mini-band in the energy filter is controlled so as to provide an inverse subthreshold slope that is smaller than about 60 millivolts per decade.

12. The device of claim 1, further comprising a dielectric layer formed on an upper surface of at least a portion of the second source/drain, wherein the energy filter is formed on an upper surface of at least a portion of the dielectric layer and the first source/drain is formed on an upper surface of at least a portion of the energy filter, the channel is formed through the dielectric layer, a first end of the channel contacting the second source/drain and a second end of the channel opposite the first end contacting the energy filter, the gate is formed in the dielectric layer between the second source/drain and the energy filter, the gate substantially surrounding the channel and being electrically isolated from the channel, the second source/drain and the energy filter.

13. The device of claim 1, wherein the channel is formed as a substantially vertical channel between the first and second source/drains.

14. The device of claim 1, wherein the gate is formed as at least a partial ring structure substantially surrounding the channel.

15. The device of claim 1, wherein the channel comprises at least one of a semiconductor nanowire and a carbon nanotube.

16. A method of forming a metal-oxide semiconductor (MOS) device, the method comprising the steps of:
   forming first and second source/drains, the first and second source/drains being spaced apart relative to one another;
   forming a channel between the first and second source/drains;
   forming a gate between the first and second source/drains and proximate the channel, the gate being electrically isolated from the first and second source/drains and channel and being configured to control a conduction of the channel as a function of a potential applied to the gate; and
   forming an energy filter between the first source/drain and the channel, the energy filter comprising a superlattice structure wherein a mini-band is formed, the energy filter being operative to control an injection of carriers from the first source/drain into the channel, the energy filter in combination with the first source/drain being configured to produce an effective zero-Kelvin first source/drain.

17. The method of claim 16, wherein the step of forming the energy filter comprises controlling an energetic width of the mini-band band in the energy filter so as to provide an inverse subthreshold slope in the device that is smaller than about 60 millivolts per decade.

18. The method of claim 16, wherein the step of forming the energy filter comprises controlling an energetic width of the mini-band band in the energy filter so as to optimize a trade-off between increased on-state current in the device and increased efficiency of the energy filter.

19. The method of claim 16, further comprising forming a dielectric layer formed on an upper surface of at least a portion of the second source/drain, wherein the energy filter is formed on an upper surface of at least a portion of the dielectric layer and the first source/drain is formed on an upper surface of at least a portion of the energy filter, the channel is formed through the dielectric layer, a first end of the channel contacting the second source/drain and a second end of the channel opposite the first end contacting the energy filter, the gate is formed in the dielectric layer between the second source/drain and the energy filter, the gate substantially surrounding the channel and being electrically isolated from the channel, the second source/drain and the energy filter.

20. The method of claim 16, wherein the step of forming the channel comprises forming a substantially vertical channel between the first and second source/drains.

21. An integrated circuit including at least one metal-oxide-semiconductor (MOS) device, the at least one MOS device comprising:
   first and second source/drains spaced apart relative to one another;
   a channel formed between the first and second source/drains;
   a gate formed between the first and second source/drains and proximate the channel, the gate being electrically isolated from the first and second source/drains and channel, the gate being configured to control a conduction of the channel as a function of a potential applied to the gate; and
   an energy filter formed between the first source/drain and the channel, the energy filter comprising a superlattice structure wherein a mini-band is formed, the energy filter being operative to control an injection of carriers from the first source/drain into the channel, the energy filter in combination with the first source/drain being configured to produce an effective zero-Kelvin first source/drain.

* * * * *